(12) United States Patent
Kothamasu

(10) Patent No.: US 11,714,713 B2
(45) Date of Patent: *Aug. 1, 2023

(54) ACCESSING ERROR STATISTICS FROM DRAM MEMORIES HAVING INTEGRATED ERROR CORRECTION

(71) Applicant: TEXAS INSTRUMENTS INCORPORATED, Dallas, TX (US)

(72) Inventor: Siva Srinivas Kothamasu, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/878,149

(22) Filed: Aug. 1, 2022

(65) Prior Publication Data

US 2022/0365849 A1  Nov. 17, 2022

Related U.S. Application Data

(63) Continuation of application No. 16/789,672, filed on Feb. 13, 2020, now Pat. No. 11,403,171, which is a
(Continued)

(51) Int. Cl.
*G06F 11/10* (2006.01)
*G06F 13/16* (2006.01)
(Continued)

(52) U.S. Cl.
CPC ...... *G06F 11/1068* (2013.01); *G06F 11/1048* (2013.01); *G06F 13/1668* (2013.01);
(Continued)

(58) Field of Classification Search
CPC ............. G06F 11/1068; G06F 11/1048; G06F 13/1668; G06F 2213/0016; G11C 29/52; G11C 5/04; G11C 2029/0411
(Continued)

(56) References Cited

U.S. PATENT DOCUMENTS 8,239,629 B2 *  8/2012  Eilert .................... G06F 13/385
                                                            711/117
9,489,326 B1 *  11/2016  Maheshwari ........ G11C 7/1075
(Continued)

FOREIGN PATENT DOCUMENTS

CN           101647004 A      2/2010

OTHER PUBLICATIONS

"128MX8, 64MX16 1G DDR3 SDRAM With ECC", IS43/46TF1640ED IS43/46TR81280ED, Integrated Silicon Solution, Inc., Rev. B, Jun. 6, 2017, pp. 1-76.
(Continued)

*Primary Examiner* — John J Tabone, Jr.
(74) *Attorney, Agent, or Firm* — Brian D. Graham; Frank D. Cimino

(57) ABSTRACT

In described examples, a memory module includes a memory array with a primary access port coupled to the memory array. Error correction logic is coupled to the memory array. A statistics register is coupled to the error correction logic. A secondary access port is coupled to the statistics register to allow access to the statistics register by an external device without using the primary interface.

20 Claims, 2 Drawing Sheets

Related U.S. Application Data continuation of application No. 15/961,010, filed on Apr. 24, 2018, now Pat. No. 10,572,344.

(60) Provisional application No. 62/490,709, filed on Apr. 27, 2017.

(51) Int. Cl.
*G11C 29/52* (2006.01)
*G11C 29/04* (2006.01)
*G11C 5/04* (2006.01)

(52) U.S. Cl.
CPC ...... *G11C 29/52* (2013.01); *G06F 2213/0016* (2013.01); *G11C 5/04* (2013.01); *G11C 2029/0411* (2013.01)

(58) Field of Classification Search
USPC .................. 714/764, 763, 768, 773, 799
See application file for complete search history.

(56) References Cited

U.S. PATENT DOCUMENTS

| | | | | |
|---|---|---|---|---|
| 9,748,002 | B2* | 8/2017 | Ken | G11C 5/04 |
| 10,824,499 | B2* | 11/2020 | Hu | G06F 11/10 |
| 2003/0007408 | A1* | 1/2003 | Lien | G11C 15/04 |
| | | | | 365/222 |
| 2008/0046666 | A1* | 2/2008 | Termaine | G06F 12/10 |
| | | | | 711/154 |
| 2008/0049505 | A1* | 2/2008 | Kim | G11C 7/1042 |
| | | | | 365/185.11 |
| 2008/0089138 | A1 | 4/2008 | Wolford et al. | |
| 2010/0030951 | A1* | 2/2010 | Kim | H01L 24/48 |
| | | | | 711/103 |
| 2010/0162037 | A1* | 6/2010 | Maule | G06F 13/1684 |
| | | | | 714/5.11 |
| 2011/0307758 | A1* | 12/2011 | Fillingim | G06F 11/1048 |
| | | | | 714/758 |
| 2012/0173792 | A1* | 7/2012 | Lassa | G06F 3/0659 |
| | | | | 711/103 |
| 2012/0304039 | A1* | 11/2012 | Peterson | H03M 13/05 |
| | | | | 714/773 |
| 2013/0019072 | A1* | 1/2013 | Strasser | G06F 3/0673 |
| | | | | 711/154 |
| 2013/0054871 | A1* | 2/2013 | Lassa | G06F 3/061 |
| | | | | 711/103 |
| 2013/0170296 | A1 | 7/2013 | Yun | |
| 2014/0075265 | A1* | 3/2014 | Hung | G11C 29/42 |
| | | | | 714/763 |
| 2014/0095750 | A1* | 4/2014 | Tailliet | G06F 13/4282 |
| | | | | 710/105 |
| 2014/0101372 | A1 | 4/2014 | Jung et al. | |
| 2014/0101519 | A1* | 4/2014 | Lee | G11C 16/26 |
| | | | | 714/773 |
| 2014/0173162 | A1* | 6/2014 | Danis | G06F 13/364 |
| | | | | 710/310 |
| 2014/0269022 | A1 | 9/2014 | Xie et al. | |
| 2015/0113356 | A1* | 4/2015 | Ken | G11C 11/005 |
| | | | | 714/764 |
| 2015/0205341 | A1* | 7/2015 | Langer | G06F 1/3296 |
| | | | | 713/322 |
| 2015/0278017 | A1 | 10/2015 | Trezise | |
| 2015/0378823 | A1 | 12/2015 | Lesartre | |
| 2016/0306006 | A1* | 10/2016 | Chadha | G11C 29/06 |
| 2016/0306011 | A1* | 10/2016 | Athimolom | G11C 29/32 |
| 2017/0153836 | A1* | 6/2017 | Kim | G06F 3/0688 |
| 2017/0160935 | A1* | 6/2017 | Gillingham | G11C 16/10 |
| 2017/0308433 | A1* | 10/2017 | Kwon | G06F 11/1048 |
| 2018/0129431 | A1* | 5/2018 | Yang | G11C 16/26 |
| 2018/0239727 | A1* | 8/2018 | Hershman | G06F 13/4221 |

OTHER PUBLICATIONS

Jonathan Valdez and Jared Becker, "Understanding the I2C Bus", SLVA704, Texas Instruments, Inc., Application Report, Jun. 2015, pp. 1-8.

1st Chinese Office Action dated Mar. 18, 2023 for Chinese Application 201880027666.2; 15 pages.

* cited by examiner

ACCESSING ERROR STATISTICS FROM DRAM MEMORIES HAVING INTEGRATED ERROR CORRECTION

CROSS-REFERENCE TO RELATED APPLICATIONS

The present application is a continuation of U.S. patent application Ser. No. 16/789,672, filed Feb. 13, 2020, which is a continuation of U.S. patent application Ser. No. 15/961,010, filed Apr. 24, 2018, now U.S. Pat. No. 10,572,344, which claims priority to U.S. Provisional Patent Application No. 62/490,709, filed Apr. 27, 2017, each of which is incorporated by reference herein in its entirety.

TECHNICAL FIELD

This relates to electronic systems that connect to memory and employ error detection and correction.

BACKGROUND

A dynamic random access memory (DRAM) subsystem that includes error correction code (ECC) circuitry may be fabricated within a single integrated circuit. These DRAM subsystems may have the ability to correct 1-bit memory errors and detect 2-bit memory errors. See, for example, Integrated Silicon Solutions, Inc. (ISSI) IS43/46TR16640ED.

SUMMARY

In a described example, error statistics may be collected and stored in a set of error statistics registers. The error statistics may be made available to an external device.

DETAILED DESCRIPTION OF EXAMPLE EMBODIMENTS

Figure 1:
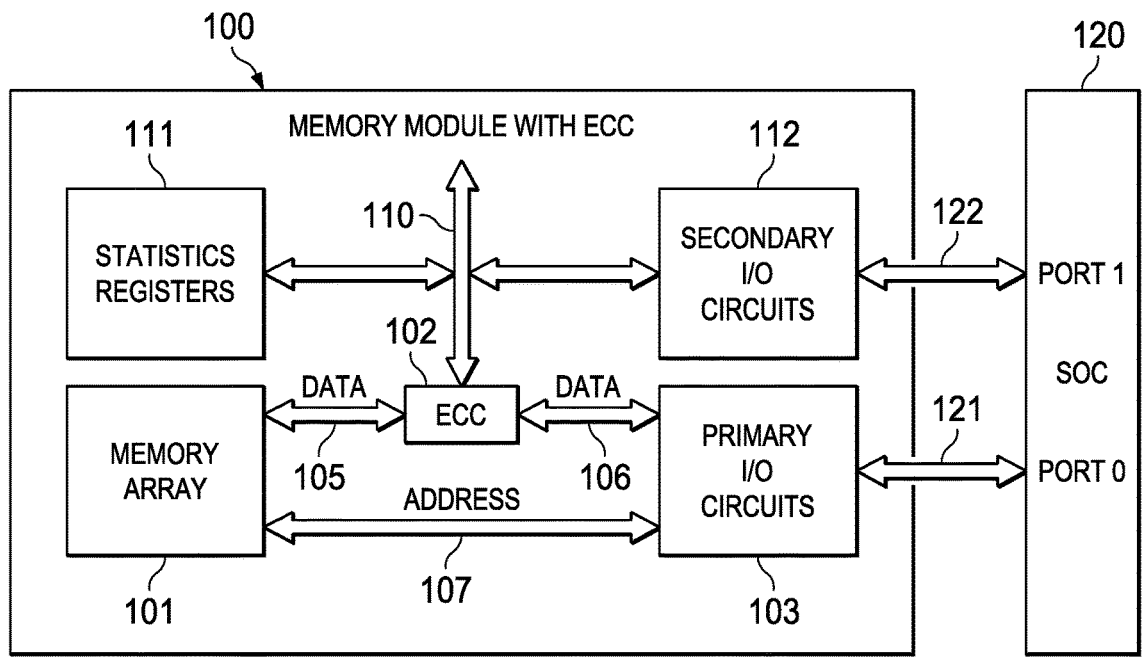
FIG. 1 illustrates an example system on chip (SOC) processing unit interfacing with a memory module with integrated ECC.

In the drawings, like elements are denoted by like reference numerals for consistency.

A DRAM subsystem that includes error correction code (ECC) circuitry may be fabricated within a single integrated circuit (IC). These DRAM subsystems may have the ability to correct 1-bit memory errors and detect 2-bit memory errors, for example. However, in currently available DRAM subsystems, error statistics and details are not readable by a system controller located outside of the memory subsystem IC, such as a host central processing unit (CPU).

In a described example, one or more statistics registers may be included within a DRAM memory module to collect error statistics and details. DRAM memories are available in standard JEDEC (Joint Electron Device Engineering Council) compatible ball grid array (BGA) packages. Utilizing some of the unused pins, an example may employ an I2C (Inter-Integrated Circuit) interface which may be used to read error registers that are internal to the DRAM memory IC.

In this manner, a host CPU may be provided with a method to read the error statistics that are stored within the DRAM IC. The CPU may use these statistics to take appropriate system action in response to excessive memory errors. Actions may range from scrubbing the memory based on the location or the number of errors to resetting the system in extreme cases. Such system level action is not possible without error statistics that are accessible by the CPU.

FIG. 1 illustrates a system on chip (SOC) processing unit 120 interfacing with a memory module 100 with integrated ECC. Memory module 100 includes memory array 101. Memory array 101 may include data bits employed for storing the data. Memory array 101 may include additional ECC bits for each word location. For example, an additional eight parity bits are required for a basic single error correction double error detection (SECDED) Hamming code for a 64-bit data word. Larger or smaller data words may require corresponding larger or smaller parity fields. Additional parity bits may be used to form Hamming codes to perform double error correction with triple error detection (DECTED). More complex systems may use BCH (Bose-Chaudhuri-Hocquenghem) codes that use polynomials over a finite field, referred to as a "Galois field." Other examples may use other known or later developed error detection and correction techniques.

In this example, SOC 120 may contain one or more processing cores, various blocks of memory and/or cache, various interface and/or peripheral devices, etc., in known or later developed configurations. An interface may be provided, such as port 0, that may be coupled to memory module 100 to allow one or more of the processing cores within SOC 120 to write data via memory bus 121 for storage in memory module 100, and to read data from memory module 100 via memory bus 121.

Memory bus 121 may include address bits and data bits that are used to address a word location in memory module 100. In this example, there are eight data bits and fourteen address bits, along with bank select bits, and various control and strobe signals. A burst transfer may be done in which eight repetitions of data are transferred to form a 64-bit word that is stored at a memory location indicated by the address bits. In another example, other known or later developed memory bus configurations may be used.

During a write transaction from SoC 120 to memory module 100, primary interface circuits 103 receive the address and data bits provided on memory bus 121. ECC logic 102 receives data bits on data bus 106 from the primary interface circuitry 103. ECC logic 102 generates corresponding ECC bits and supplies both the data bits and the newly generated error correction bits to memory array 101 via data bus 105. These are stored in memory array 101 at the address provided from primary interface circuitry 103 on address bus 107 using known or later developed memory storage techniques.

Memory array 101 stores the data and ECC bits in addressable locations. Memory array 101 may be implemented using known or later developed memory technology. In this example, memory array 101 may use dynamic random access memory (DRAM) cells. In another example, memory array 101 may be implemented with nonvolatile memory cells, such as ferroelectric cells. In another example, memory array 101 may be implemented using flash memory cells. In another example, memory array 101 may be implemented using static random access memory (SRAM), etc.

When reading data from memory array 101, an address on address bus 107 determines the memory location accessed. The data and error correction bits are recalled from memory array 101 and supplied to ECC logic 102 via data bus 105. ECC logic 102 then generates a new set of error correction bits from the recalled data. ECC logic 102 compares these newly generated error correction bits to corresponding error correction bits recalled from memory array 101. If they match, ECC logic 102 supplies the data bits to data bus 106. Primary I/O circuits 103 then transfer this data to SOC 120 via bus 121. If the new and recalled ECC bits do not match, ECC logic 102 determines if error correction is possible. The number of redundant bits determines whether a detected error can be corrected. For example, a known Hamming scheme can detect errors in two bits and detect and correct an error occurring in a single bit. If ECC logic 102 determines it can correct a detected error, it makes this correction and supplies the corrected data to primary I/O circuits 103 via data bus 106. In this example, ECC logic 102 updates statistics registers 111 via bus 110 to record the occurrence of a corrected memory error. In this example, the address and the bit that was corrected is stored. In another example, less information may be recorded.

If ECC logic 102 determines it cannot correct a detected error, it halts the read operation and transmits an error message to SOC 102 via primary bus 121. ECC logic 102 also updates statistics registers 111 via bus 110 to record the occurrence of an uncorrected error. In this example, the address of the memory location that failed is recorded.

In this example, a processor in SOC 120 may access statistics registers 111 via secondary bus 122, secondary I/O circuits 112 and bus 110. In particular, a processor in SOC 120 may be programmed to read data from statistics registers 111 upon a read error. In addition, a processor in SOC 120 may be programmed to periodically read statistics registers 111 in order to be appraised of otherwise undetectable bit errors that ECC logic 102 corrects.

In this example, secondary bus 122 may be a well-known I2C bus. The I2C bus may also be referred to as "I²C" or "IIC." The I2C bus is a synchronous, multi-master, multi-slave, packet switched, single ended, serial computer bus that includes two bi-directional lines. I2C uses an open-drain/open-collector with an input buffer on the same line, which allows a single data line to be used for bidirectional data flow. Thus, when implemented as an I2C bus, only two signal lines are required for secondary bus 122; therefore, only two ball contacts are required to connect secondary bus 122 to memory module 100.

Open-drain refers to a type of output which can either pull the bus down to a voltage (ground, in most cases), or "release" the bus and let it be pulled up by a pull-up resistor. In the event of the bus being released by the master or a slave, the pull-up resistor (RPU) on the line is responsible for pulling the bus voltage up to the power rail. Since no device may force a high on a line, this means that the bus will never run into a communication issue where one device may try to transmit a high, and another transmits a low, causing a short (power rail to ground). I2C requires that if a master in a multi-master environment transmits a high, but sees that the line is low (another device is pulling it down), to halt communications because another device is using the bus. Push-pull interfaces do not allow for this type of freedom, which is a benefit of I2C.

Operation of the I2C bus is well known and need not be described in detail herein; see, for example, "Understanding the I2C Bus," Texas Instruments Application Report SLVA704, June 2015, which is incorporated by reference herein.

I2C uses only two bidirectional open-drain lines, Serial Data Line (SDA) and Serial Clock Line (SCL), pulled up with resistors. Typical voltages used are +5 V or +3.3 V, although systems with other voltages are permitted.

The I2C reference design has a 7-bit address space, with a rarely-used 10-bit extension. Common I2C bus speeds are the 100 kbit/s standard mode and the 400 kbit/s Fast mode. There is also a 10 kbit/s low-speed mode, but arbitrarily low clock frequencies are also allowed. Recent revisions of I2C can host more nodes and run at faster speeds (400 kbit/s Fast mode, 1 Mbit/s Fast mode plus or Fm+, and 3.4 Mbit/s High Speed mode). These speeds are more widely used on embedded systems than on printed circuit boards.

It would be possible to design statistics registers 111 so that they could be accessed via primary bus 121 using memory mapped accesses, for example. However, use of the I2C bus as a secondary bus to access statistics registers 111 allows a processor on SOC 120 or elsewhere to monitor statistics registers 111 without interrupting operation of the primary memory bus 121.

Furthermore, the open collector operation of the I2C bus allows secondary bus 122 to operate at a different voltage than primary bus 121. For example, in this example primary bus 121 may be a double data rate 3 (DDR3) bus that operates at approximately 1.35 or 1.5 volts. In another example, a DDR4 bus may be used that operates at 1.2 volts, or a DDR2 bus that operates at 1.8 volts. Likewise, memory 101, ECC logic 102, an interface circuits 102, and statistics registers 111 may operate on the DDR supply voltage. In each example, the secondary I2C open collector bus 122 may be operated at a totally different voltage, such as 1.8 volts or 3.3 volts, for example that is provided by interface logic on SoC 120.

Figure 2:
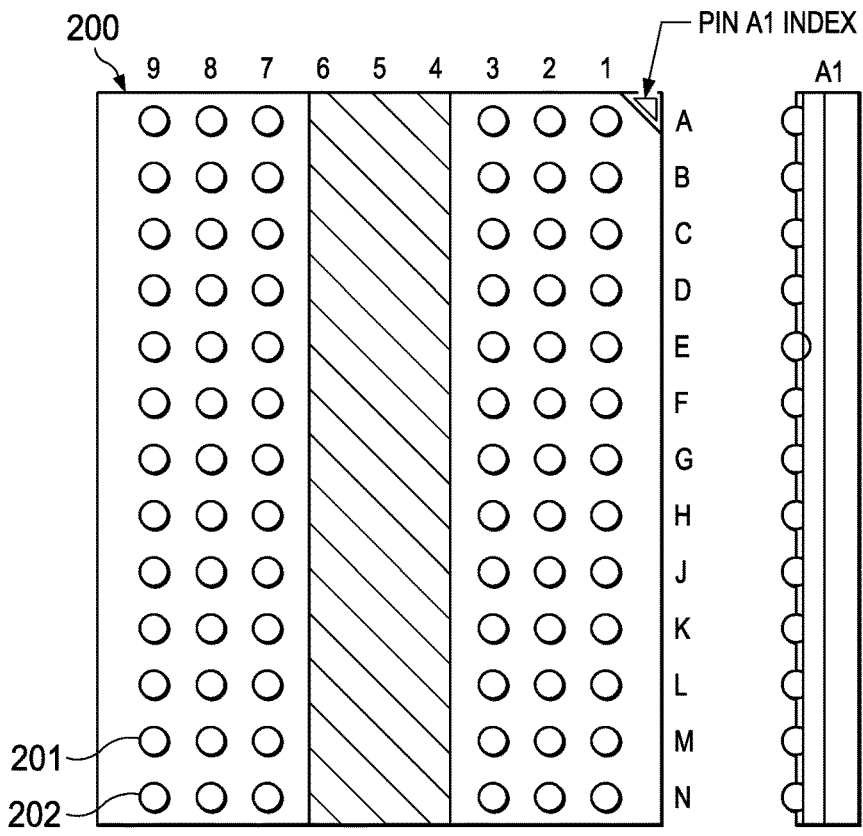
FIG. 2 illustrates an example ball grid array package.

FIG. 2 illustrates an example ball grid array package 200 that may be used to package memory module 100. A ball grid array (BGA) is a type of surface-mount packaging (a chip carrier) used for integrated circuits. BGA packages are used to permanently mount devices such as microprocessors. A BGA can provide more interconnection pins than can be put on a dual in-line or flat package. The whole bottom surface of the device can be used, instead of just the perimeter. The leads are also on average shorter than with a perimeter-only type, leading to better performance at high speeds.

As mentioned above, only two signal lines are required for secondary bus 122 in an example where secondary bus is provided as an I2C type of bus; therefore, only two ball contacts, such as ball contacts 201, 202, are required to connect secondary bus 122 to memory module 100. While two particular ball contacts 201, 202 are indicated for this example, other examples may use different ball contact positions. Further, while an I2C bus requires only two ball contacts, it is also contemplated that secondary bus 122 may also be implemented with other bus types with two signal lines, other bus types with more than two signal lines (in which case more than two ball contacts would connect secondary bus 122 to memory module 100), or in some cases using a single signal line (in which case only one ball contact would connect secondary bus 122 to memory module 100

Figure 3:
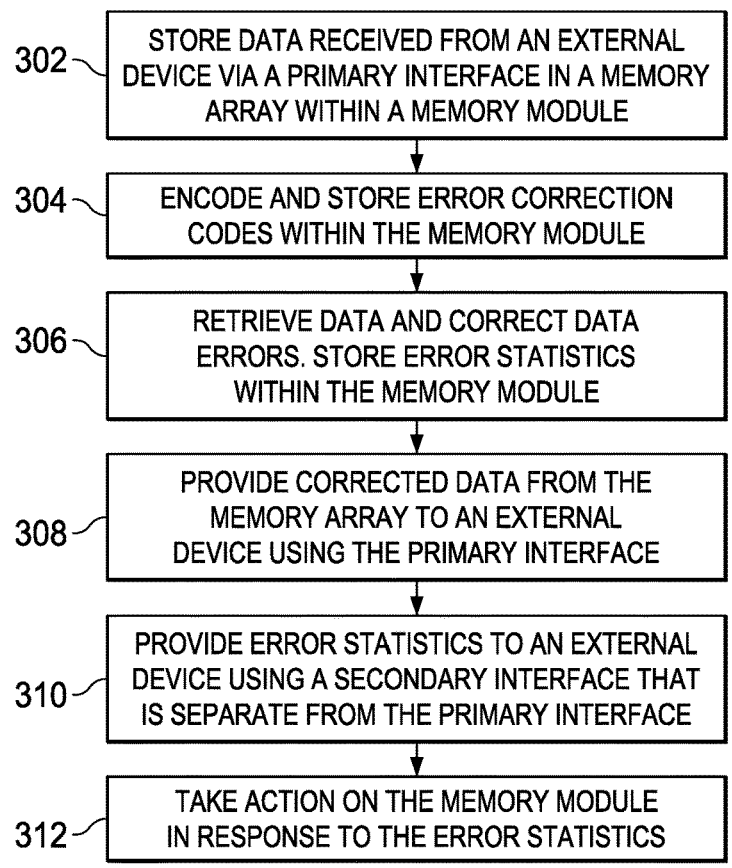
FIG. 3 is a flow diagram illustrating use of a secondary bus to access statistics registers on a memory module.

FIG. 3 is a flow diagram illustrating use of a secondary bus to access statistics registers on a memory module. At 302, data is stored in a memory array within the memory module. The data may be received from an external device, such as SoC 120 in FIG. 1, using a primary interface such as interface circuits 103 in FIG. 1.

At 304, error correction codes are encoded by ECC logic, such as ECC logic 102 in FIG. 1. The error correction codes are stored within the memory module.

At 306, data is retrieved from the memory array in response to a read request by an external device connected to the primary interface. Data errors in the data retrieved from the memory array may be corrected by the ECC logic. Data error statistics may be stored within the memory module, such as within statistics registers 111 in FIG. 1.

At 308, corrected data is provided to an external device using the primary interface. The data may be provided to a same external device that provided the data in 302, or a different external device may request access to the memory module.

At 310, error statistics may be provided to an external device using a secondary interface that is separate from the primary interface, such as secondary interface 112 and secondary bus 122 in FIG. 1. The secondary interface may be an I2C bus, for example, or another known or later developed communication channel.

At 312, action may be taken on the memory module in response to the error statistics. For example, a host CPU that is coupled to the memory module may use these statistics to take appropriate system action in response to excessive memory errors. Actions may range from scrubbing the memory based on the location or the number of errors to resetting the system in extreme cases. Such system level action may not be possible without error statistics that are accessible by the CPU.

Figure 4:
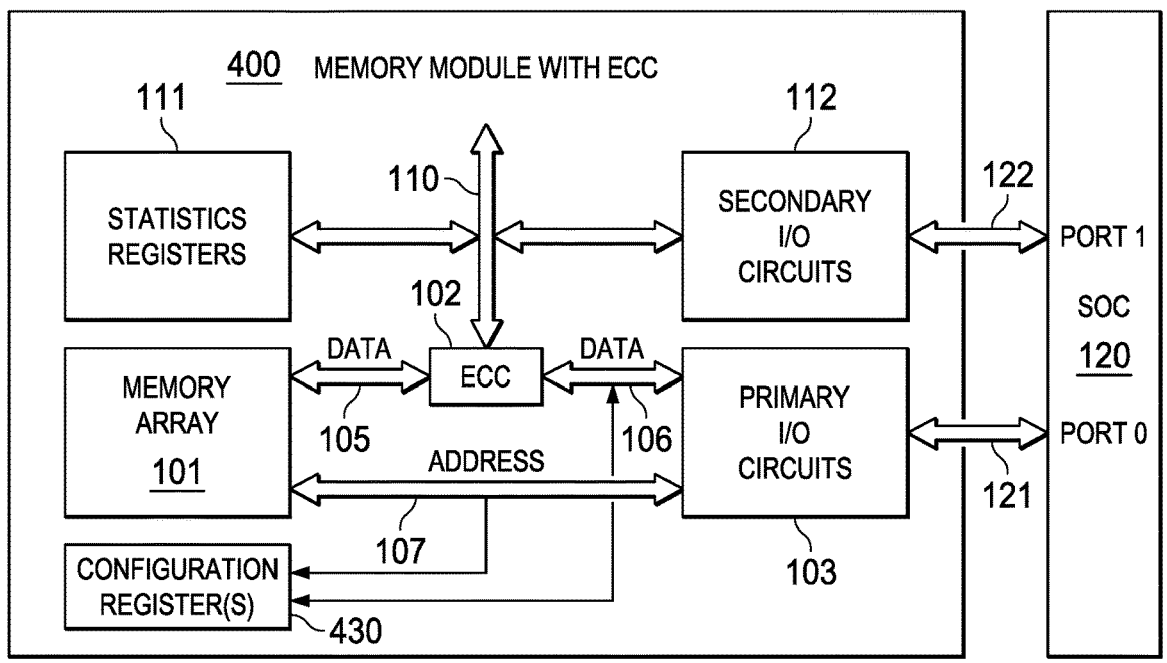
FIG. 4 illustrates another example memory module with integrated ECC.

FIG. 4 illustrates another example memory module 400 with integrated ECC logic. This example may be similar to memory module 400 in FIG. 1. This example may include additional control logic, such as configuration register(s) 430 that may be accessed via primary interface circuits 103. These configuration register(s) may be used to configure the operation of memory module 400. For example, various parameters may be configured, such as: burst length, CAS latency, test mode, precharge delay, drive strength, termination impedance, etc. Other known or later developed types of memory module parameters may be configured in this manner.

Configuration register(s) 430 may be written to and read from using primary interface 103 and primary interface bus 121.

OTHER EMBODIMENTS

In described examples, a memory module that includes ECC logic and statistics registers is packaged in a BGA package. Other examples may be packaged in other types of known or later developed packages that can provide two contact points for an I2C interface.

In described examples, an I2C interface is used to access statistics registers internal to a memory module. In other examples, other known or later developed types of low pin-count communication buses may be used to access the internal statistics registers.

In described examples, a memory module with ECC logic is described. In other examples, additional logic, such as a processor core, sensor interface logic, or other types of logic may be included within the memory module.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. A circuit device comprising:
a first set of pins configured to couple to a first interface of a memory device, wherein:
the memory device includes a memory array; and
the first set of pins is configured to provide a transaction to access the memory array; and
a second set of pins that is different from the first set of pins and is configured to couple to a second interface of the memory device, wherein:
the memory device further includes a statistics register configured to store error correction code (ECC) statistics with respect to the memory array; and
the second set of pins is configured to access the statistics register.

2. The circuit device of claim 1, wherein the second set of pins is configured to access the statistics register using an I2O protocol.

3. The circuit device of claim 1, wherein the second set of pins is configured to access the statistics register without interrupting operation of the transaction.

4. The circuit device of claim 1, wherein the ECC statistics indicate whether an error was detected with respect to the memory array.

5. The circuit device of claim 4, wherein the ECC statistics indicate whether the error was corrected.

6. The circuit device of claim 4, wherein the ECC statistics indicate an address and a bit identifier of a bit corrected by the memory device.

7. The circuit device of claim 1, wherein the ECC statistics indicate an address associated with an uncorrected error.

8. The circuit device of claim 1, wherein the first set of pins and the second set of pins operate at different voltages.

9. The circuit device of claim 1, wherein:
the memory device includes a configuration register; and
the first set of pins is configured to provide a transaction to access the configuration register.

10. A circuit device comprising:
a first interface configured to couple to a memory device that includes a memory array to provide a transaction directed to the memory array; and
a second interface that is distinct from the first interface and is configured to couple to the memory device to receive error correction code (ECC) statistics associated with the memory array, wherein the second interface includes a serial data line and a serial clock line.

11. The circuit device of claim 10, wherein each of the serial data line and the serial clock line is a bidirectional open-drain line.

12. The circuit device of claim 10, wherein the second interface is configured to receive the ECC statistics without interrupting the transaction associated with the first interface.

13. The circuit device of claim 10, wherein the first interface and the second interface operate at different voltages.

14. A method comprising:
　providing, via a first interface, a transaction to access a memory array of a memory device; and
　accessing, via a second interface that is distinct from the first interface, error correction code (ECC) statistics associated with the memory array and stored in a statistics register of the memory device.

15. The method of claim 14, wherein the accessing of the ECC statistics utilizes an I2C protocol.

16. The method of claim 14 further comprising performing the transaction by the memory device, wherein the accessing of the ECC statistics is concurrent with the performing of the transaction by the memory device.

17. The method of claim 14, wherein the ECC statistics indicate whether an error was detected with respect to the memory array.

18. The method of claim 17, wherein the ECC statistics indicate whether the error was corrected.

19. The method of claim 17, wherein the ECC statistics indicate an address and a bit identifier of a bit corrected by the memory device.

20. The method of claim 17, wherein the ECC statistics indicate an address associated with an uncorrected error.

\* \* \* \* \*